(12) United States Patent
Yang (10) Patent No.: US 12,055,599 B2
(45) Date of Patent: Aug. 6, 2024

(54) BATTERY SAMPLING CHIP AND BATTERY MANAGEMENT SYSTEM

(71) Applicant: CONTEMPORARY AMPEREX TECHNOLOGY CO., LIMITED, Ningde (CN)

(72) Inventor: Ye Yang, Ningde (CN)

(73) Assignee: CONTEMPORARY AMPEREX TECHNOLOGY CO., LIMITED, Ningde (CN)

(*) Notice: Subject to any disclaimer, the term of this patent is extended or adjusted under 35 U.S.C. 154(b) by 0 days.

(21) Appl. No.: 18/459,402

(22) Filed: Aug. 31, 2023

(65) Prior Publication Data

US 2023/0408600 A1 Dec. 21, 2023

Related U.S. Application Data

(63) Continuation of application No. PCT/CN2021/121409, filed on Sep. 28, 2021.

(51) Int. Cl.
*G01R 31/396* (2019.01)
*H01M 10/42* (2006.01)
*H01M 10/48* (2006.01)

(52) U.S. Cl.
CPC ........ *G01R 31/396* (2019.01); *H01M 10/425* (2013.01); *H01M 10/482* (2013.01); *H01M 2010/4271* (2013.01)

(58) Field of Classification Search
CPC ............................ G01R 31/396; H01M 10/425
(Continued)

(56) References Cited

U.S. PATENT DOCUMENTS

2015/0015267 A1 1/2015 Mueller et al.
2016/0303977 A1 10/2016 Kudo et al.
2023/0064240 A1* 3/2023 Zhou .................... G01R 27/02

FOREIGN PATENT DOCUMENTS

CN 102231549 A 11/2011
CN 204989827 U 1/2016
(Continued)

OTHER PUBLICATIONS

International Search Report received in the corresponding International Application PCT/CN2021/121409, mailed Jun. 13, 2022.
(Continued)

*Primary Examiner* — Vincent Q Nguyen
(74) *Attorney, Agent, or Firm* — Kilpatrick Townsend & Stockton LLP (57) ABSTRACT

A battery sampling chip and a battery management system. The battery sampling chip includes a selector module, including a first multiplexer and a second multiplexer, wherein the first multiplexer and the second multiplexer are both used to collect status data of a first group of cells; an analog-to-digital conversion module, connected with the first multiplexer and the second multiplexer; and a data control module, used to send alarm information when converted status data sent by the analog-to-digital conversion module are not received within a preset duration. Through redundancy design of the multiplexers, whether the selector module fails or is abnormal can be effectively judged, thus avoiding the battery management system including the battery sampling chip from monitoring incorrect status data.

9 Claims, 3 Drawing Sheets

(58) Field of Classification Search
USPC .......................................... 324/426, 432–435
See application file for complete search history.

(56) References Cited

FOREIGN PATENT DOCUMENTS

| | | |
|---|---|---|
| JP | 2013102318 A | 5/2013 |
| JP | 2017070024 A | 4/2017 |

OTHER PUBLICATIONS

Written Opinion received in the corresponding International Application PCT/CN2021/121409, mailed Jun. 13, 2022.
The extended European Search Report received in the corresponding European Application 21958677.3, mailed Mar. 27, 2024.

* cited by examiner

BATTERY SAMPLING CHIP AND BATTERY MANAGEMENT SYSTEM

CROSS-REFERENCE TO RELATED APPLICATIONS

The present application is a continuation of International Application No. PCT/CN2021/121409, filed on Sep. 28, 2021, named "BATTERY SAMPLING CHIP AND BATTERY MANAGEMENT SYSTEM", the entire content of which is incorporated herein by reference.

TECHNICAL FIELD

The present application relates to the technical field of batteries, in particular to a battery sampling chip and a battery management system.

BACKGROUND

In order to ensure the safety and reliability of batteries in devices (such as new energy vehicles, drones, etc.) it is necessary to set up a battery management system in the equipment to monitor the status of the battery. The battery management system collects voltage and temperature data of the battery through a battery sampling chip. An inventor found in the research that reliability of a current battery sampling chip, such as an analog front end (AFE) sampling chip, is low. When the AFE sampling chip fails or is abnormal, the data collected by it is usually invalid data. The existing technology cannot identify the invalid data in time, resulting in a dangerous monitoring status of the battery management system.

SUMMARY OF THE INVENTION

An objective of an embodiment of the present application is to provide a battery sampling chip and a battery management system, so as to timely identify incorrect data collected by the battery sampling chip due to its own failure or abnormality, so as to ensure safety monitoring of the battery management system.

The present disclosure is implemented as follows.

In a first aspect, an embodiment of the present application provides a battery sampling chip, including: a selector module, including: a first multiplexer and a second multiplexer, the first multiplexer and the second multiplexer being both used to collect status data of a first group of cells; an analog-to-digital conversion module, connected with the first multiplexer and the second multiplexer, the analog-to-digital conversion module being used to send a first abnormality feedback instruction to the first multiplexer and the second multiplexer when the status data of the first group of cells respectively collected by the first multiplexer and the second multiplexer are different, and perform analog-to-digital conversion on the status data of the first group of cells when the status data of the first group of cells respectively collected by the first multiplexer and the second multiplexer are the same; and a data control module, connected with the analog-to-digital conversion module, the data control module being used to receive converted status data sent by the analog-to-digital conversion module, and send alarm information when the converted status data sent by the analog-to-digital conversion module are not received within a preset duration.

In the embodiment of the present application, the selector module in the battery sampling chip includes two multiplexers both used to collect the status data of the first group of cells. When the status data of the first group of cells collected by the two multiplexers are inconsistent, it represents that the selector module fails or is abnormal, and incorrect sampling data will not be output at this time. It can be seen that through redundancy design of the multiplexers, whether the selector module fails or is abnormal can be effectively judged, thus avoiding the battery management system including the battery sampling chip from monitoring incorrect status data. Compared with the prior art, the battery sampling chip provided by the embodiments of the present application enhances safety of the battery management system while improving its own reliability.

In combination with the technical solution provided in the first aspect above, in some possible implementations, the selector module further includes a third multiplexer and a fourth multiplexer; the third multiplexer and the fourth multiplexer are both used to collect status data of a second group of cells, the first group of cells and the second group of cells include the same first cell, and the first group of cells and the second group of cells belong to the same device; and the analog-to-digital conversion module is further connected with the third multiplexer and the fourth multiplexer, the analog-to-digital conversion module is further used to send a second abnormality feedback instruction to the third multiplexer and the fourth multiplexer when the status data of the second group of cells respectively collected by the third multiplexer and the fourth multiplexer are different; send a third abnormality feedback instruction to the first multiplexer, the second multiplexer, the third multiplexer and the fourth multiplexer when status data of the first cell respectively collected by the first multiplexer, the second multiplexer, the third multiplexer and the fourth multiplexer are different; and perform analog-to-digital conversion on the status data of the second group of cells when the status data of the second group of cells respectively collected by the third multiplexer and the fourth multiplexer are the same.

In the embodiment of the present application, the selector module further includes the third multiplexer and the fourth multiplexer, the third multiplexer and the fourth multiplexer are both used to collect the status data of the second group of cells, and the first group of cells and the second group of cells include the same first cell. Through the same first cell, cross verification of the status data collected among the first multiplexer, the second multiplexer, the third multiplexer and the fourth multiplexer can be realized, whether the first multiplexer and the second multiplexer fail at the same time or whether the third multiplexer and the fourth multiplexer fail at the same time can be effectively verified, and thus when a group of multiplexers fail, abnormal sampling data will not be output, thereby further improving the reliability of the battery sampling chip.

In combination with the technical solution provided in the first aspect above, in some possible implementations, the analog-to-digital conversion module includes a first analog-to-digital converter, a second analog-to-digital converter and a sampling data comparison unit; the first analog-to-digital converter and the second analog-to-digital converter are two analog-to-digital converters with different precision; the first analog-to-digital converter and the second analog-to-digital converter are both connected with the first multiplexer, the second multiplexer and the sampling data comparison unit; and the sampling data comparison unit is further connected with the data control module; the first analog-to-digital converter and the second analog-to-digital converter are both used to perform analog-to-digital conversion on the status data of the first group of cells; and the sampling data comparison unit is used to obtain digital quantities converted by the first analog-to-digital converter and the second analog-to-digital converter, and convert the two digital quantities into digital quantities under first precision respectively; send the digital quantities under the first precision to the data control module when the two digital quantities under the first precision are the same, wherein the digital quantities under the first precision are the converted status data; and trigger the data control module to alarm when the two digital quantities under the first precision are different.

In the embodiment of the present application, the analog-to-digital conversion module also adopts the redundancy design, and the first analog-to-digital converter and the second analog-to-digital converter are the two analog-to-digital converters with different precision. In this way, abnormal data output in a conversion process due to common mode failure of the analog-to-digital converters can be effectively avoided.

In combination with the technical solution provided in the first aspect above, in some possible implementations, the first analog-to-digital converter is an 11-bit analog-to-digital converter, and the second analog-to-digital converter is a 16-bit analog-to-digital converter.

In combination with the technical solution provided in the first aspect above, in some possible implementations, the sampling data comparison unit is further used to lock a faulty analog-to-digital converter when the two digital quantities under the first precision are different, and the faulty analog-to-digital converter is an analog-to-digital converter corresponding to the digital quantity with a large difference value from a preset quantity in the two digital quantities under the first precision.

In the embodiment of the present application, when the two digital quantities under the first precision are different, the sampling data comparison unit may further lock the faulty analog-to-digital converter, so that subsequent maintenance personnel carry out maintenance directly and save the fault detection time of the maintenance personnel.

In combination with the technical solution provided in the first aspect above, in some possible implementations, the battery sampling chip further includes a reference voltage calibration module; the reference voltage calibration module is respectively connected with the analog-to-digital conversion module and the data control module; and the reference voltage calibration module is used to collect a power supply voltage of the battery sampling chip and a power supply voltage of the analog-to-digital conversion module; and compare the power supply voltage of the battery sampling chip with the power supply voltage of the analog-to-digital conversion module, and trigger the data control module to alarm when the comparison result is inconsistent.

In the embodiment of the present application, the battery sampling chip further includes the reference voltage calibration module, and the reference voltage calibration module is connected with the analog-to-digital conversion module. Through the reference voltage calibration module, whether the power supply voltage of the analog-to-digital conversion module is abnormal can be effectively identified, thus avoiding a case that sampling precision of the battery sampling chip is inaccurate due to interference of environmental factors, and further improving the reliability of the battery sampling chip.

In combination with the technical solution provided in the first aspect above, in some possible implementations, the reference voltage calibration module is further connected with the selector module, and the reference voltage calibration module is further used to collect a power supply voltage of the selector module, compare the power supply voltage of the battery sampling chip with the power supply voltage of the selector module, and trigger the data control module to alarm when the comparison result is inconsistent.

In the embodiment of the present application, the reference voltage calibration module is further connected with the selector module. Through the reference voltage calibration module, whether the power supply voltage of the selector module is abnormal can be effectively identified, thus avoiding the case that sampling precision of the battery sampling chip is inaccurate due to interference of environmental factors, and further improving the reliability of the battery sampling chip.

In combination with the technical solution provided in the first aspect above, in some possible implementations, the battery sampling chip further includes a sleep detection module; and the sleep detection module is respectively connected with the analog-to-digital conversion module and the data control module, and the sleep detection module is used to compare the converted status data transmitted by the analog-to-digital conversion module with a preset value when a device connected with the battery sampling chip is in a sleep state, and trigger the data control module to alarm when the comparison result is inconsistent.

In the embodiment of the present application, the battery sampling chip is further integrated with the sleep detection module, which can save space resources and energy consumption of a controller compared with the prior art that a sleep detection module is arranged in a controller of a battery management system.

In combination with the technical solution provided in the first aspect above, in some possible implementations, the status data include voltage data and/or temperature data.

In a second aspect, an embodiment of the present application provides a battery management system, including a controller and the battery sampling chip provided in the embodiment of the first aspect above, wherein the controller is connected with the data control module of the battery sampling chip, and the controller is used to obtain status data of a battery collected by the battery sampling chip.

BRIEF DESCRIPTION OF THE DRAWINGS

In order to illustrate technical solutions of embodiments of the present application more clearly, drawings needing to be used in the embodiments of the present application will be introduced below briefly. It should be understood that the drawings below only show some embodiments of the present application, and should not be regarded as limitation on the scope. Those ordinarily skilled in the art can further obtain other related drawings according to these drawings without creative efforts.

Icon: 100—Battery sampling chip; 10—Selector module; 11—First multiplexer; 12—Second multiplexer; 13—Third multiplexer; 14—Fourth multiplexer; 20—Analog-to-digital conversion module; 21—First analog-to-digital converter; 22—Second analog-to-digital converter; 23—Sampling data comparison unit; 30—Data control module; 40—Reference voltage calibration module; 50—Sleep detection module; 200—Battery management system; and 300—Controller.

DETAILED DESCRIPTION

Technical solutions in embodiments of the present application will be described below with reference to drawings in the embodiments of the present application.

Figure 1:
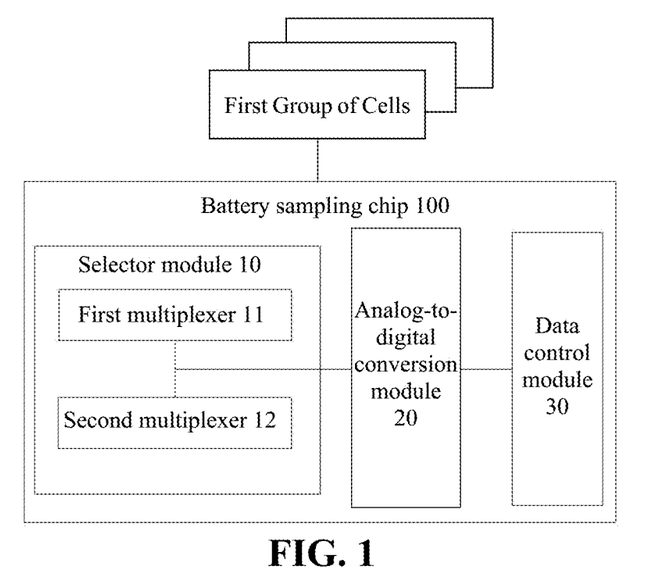
FIG. 1 is a module block diagram of a first battery sampling chip provided by an embodiment of the present application.

Please refer to FIG. 1, an embodiment of the present application provides a battery sampling chip 100, including a selector module 10, an analog-to-digital conversion module 20 and a data control module 30. The analog-to-digital conversion module 20 is connected with the selector module 10 and the data control module 30 respectively.

The selector module 10 is mainly used to collect status data of a battery, and the battery includes a plurality of cells. In the embodiment of the present application, the selector module 10 includes a first multiplexer 11 and a second multiplexer 12. The first multiplexer 11 is connected with the second multiplexer 12. The first multiplexer 11 and the second multiplexer 12 are both used to collect status data of a first group of cells. The first group of cells may refer to all cells in the battery, or some cells in the battery. When the first group of cells is part of the cells in the battery, the selector module 10 further includes more multiplexers to sample other cells.

It should be noted that the multiplexer (mux) is a multi-input and single-output combined logic circuit. Therefore, one multiplexer may simultaneously sample the plurality of cells. For example, the first group of cells includes eight cells, and the first multiplexer 11 and the second multiplexer 12 may simultaneously collect the status data of the eight cells.

Optionally, the status data of the cells may be either voltage data of the cells or temperature data of the cells. Certainly, the battery sampling chip 100 may also sample the voltage data and the temperature data of the cells simultaneously, which is not limited by the present application.

The analog-to-digital conversion module 20 is mainly used for conversion of an analog quantity and a digital quantity. The analog-to-digital conversion module 20 is connected with the first multiplexer 11 and the second multiplexer 12. In the embodiment of the present application, the analog-to-digital conversion module 20 is used to send a first abnormality feedback instruction to the first multiplexer 11 and the second multiplexer 12 when the status data of the first group of cells respectively collected by the first multiplexer 11 and the second multiplexer 12 are different, and perform analog-to-digital conversion on the status data of the first group of cells when the status data of the first group of cells respectively collected by the first multiplexer 11 and the second multiplexer 12 are the same.

Exemplarily, the first multiplexer 11 and the second multiplexer 12 are both used to collect the status data of a number-one cell to a number-eight cell. When the analog-to-digital conversion module 20 receives the different status data of the number-one cell to the number-eight cell collected by the first multiplexer and the second multiplexer, it represents that the selector module 10 fails or is abnormal. At this time, analog-to-digital conversion is not performed on the collected status data (that is, incorrect sampling data will not be output), instead, the first abnormality feedback instruction is sent to the first multiplexer 11 and the second multiplexer 12. When the analog-to-digital conversion module 20 receives the same status data of the number-one cell to the number-eight cell collected by the first multiplexer and the second multiplexer, it represents that the selector module 10 in a normal work state. At this time, analog-to-digital conversion is performed on the status data of the first group of cells. When the status data are the same, it may be set at this time that analog-to-digital conversion is performed according to the status data collected by any multiplexer. For example, it may be set that the analog-to-digital conversion is performed based on the status data of the first group of cells collected by the first multiplexer 11.

It should be noted that whether the status data are the same may be judged by one preset comparison threshold. For example, when a difference value between the status data respectively collected by the first multiplexer 11 and the second multiplexer 12 is less than the preset comparison threshold, it represents that the status data collected by the two are the same, and when the difference value between the status data respectively collected by the first multiplexer 11 and the second multiplexer 12 is greater than the preset comparison threshold, the status data collected by the two are different. A specific value of the preset comparison threshold may be determined according to the actual situation, and the value is not limited here.

The data control module 30 is connected with the analog-to-digital conversion module 20. The data control module 30 is used to receive converted status data sent by the analog-to-digital conversion module 20, and send alarm information when the converted status data sent by the analog-to-digital conversion module 20 is not received within a preset duration.

That is, the data control module 30 contains two data control modes. The first mode is that the analog-to-digital conversion module 20 does not detect the abnormality of the selector module 10, at this time, the data control module 30 can receive the converted status data sent by the analog-to-digital conversion module 20, so that the data control module 30 subsequently outputs the converted status data to a controller of the battery management system connected with the battery sampling chip 100, wherein, the data control module 30 may include a data register unit to store the converted status data. When the data control module 30 does not receive the converted status data sent by the analog-to-digital conversion module 20 within the preset duration, it means that the collected data are interrupted at the analog-to-digital conversion module 20, that is, the status data collected by the selector module 10 are incorrect. At this time, the data control module sends the alarm information. A specific value of the preset duration above may be determined according to the actual situation, and the value is not limited here.

To sum up, in the embodiment of the present application, the selector module 10 in the battery sampling chip 100 includes two multiplexers both used to collect the status data of the first group of cells. When the status data of the first group of cells collected by the two multiplexers are inconsistent, it represents that the selector module fails or is abnormal, and the incorrect sampling data will not be output at this time. It can be seen that through redundancy design of the multiplexers, whether the selector module 10 fails or is abnormal can be effectively judged, thus avoiding the battery management system including the battery sampling chip 100 from monitoring the incorrect status data. Compared with the prior art, the battery sampling chip 100 provided by the embodiments of the present application enhances the safety of the battery management system while improving its reliability.

Figure 2:
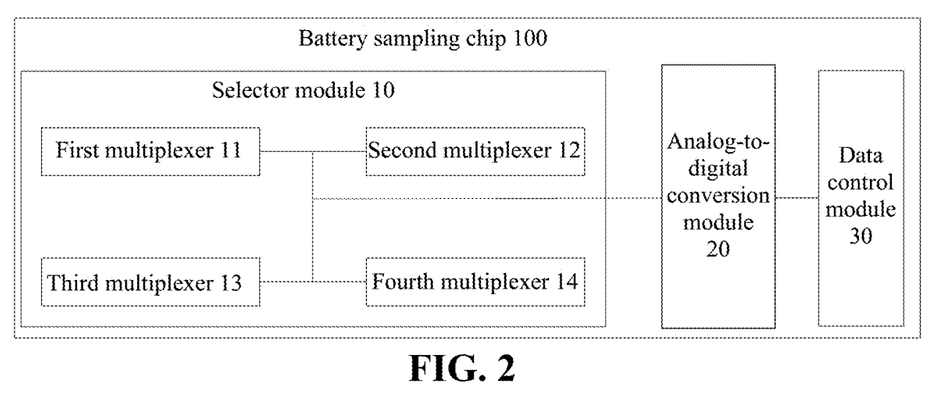
FIG. 2 is a module block diagram of a second battery sampling chip provided by an embodiment of the present application.

Please refer to FIG. 2, optionally, the selector module 10 further includes a third multiplexer 13 and a fourth multiplexer 14. The third multiplexer 13 is connected with the fourth multiplexer 14, and the third multiplexer 13 and the fourth multiplexer 14 are further connected with the first multiplexer 11 and the second multiplexer 12, that is, the four multiplexers are connected. The third multiplexer 13 and the fourth multiplexer 14 are both used to collect status data of a second group of cells.

The first group of cells and the second group of cells include the same first cell, and the first group of cells and the second group of cells belong to the same device.

Exemplarily, the first group of cells and the second group of cells belong to the same new energy vehicle. The new energy vehicle includes 16 cells. The 16 cells are numbered in order to obtain the number-one cell to a number-sixteen cell. The first group of cells is the number-one cell to a number-ten cell, and the second group of cells is the number-ten cell to the number-sixteen cell. The number-ten cell is the first cell. The first multiplexer 11, the second multiplexer 12, the third multiplexer 13 and the fourth multiplexer 14 will collect the status data of the number-ten cell.

The analog-to-digital conversion module 20 is further connected with the third multiplexer 13 and the fourth multiplexer 14. The analog-to-digital conversion module 20 is further used to send a second abnormality feedback instruction to the third multiplexer 13 and the fourth multiplexer 14 when the status data of the second group of cells respectively collected by the third multiplexer 13 and the fourth multiplexer 14 are different; send a third abnormality feedback instruction to the first multiplexer 11, the second multiplexer 12, the third multiplexer 13 and the fourth multiplexer 14 when status data of the first cell respectively collected by the first multiplexer 11, the second multiplexer 12, the third multiplexer 13 and the fourth multiplexer 14 are different; and perform analog-to-digital conversion on the status data of the second group of cells when the status data of the second group of cells respectively collected by the third multiplexer 13 and the fourth multiplexer 14 are the same.

That is, when the selector module 10 simultaneously includes the first multiplexer 11, the second multiplexer 12, the third multiplexer 13 and the fourth multiplexer 14, there will be four processing cases for the analog-to-digital conversion module 20. The first case is that when the status data of the first group of cells collected by the first multiplexer 11 and the second multiplexer 12 are the same, the status data of the second group of cells collected by the third multiplexer 13 and the fourth multiplexer 14 are the same, and the status data of the first cell collected by the first multiplexer 11, the second multiplexer 12, the third multiplexer 13 and the fourth multiplexer 14 are the same as well, the analog-to-digital conversion module 20 performs analog-to-digital conversion on the status data of the first group of cells and the status data of the second group of cells respectively. The second case is that when the status data of the first group of cells collected by the first multiplexer 11 and the second multiplexer 12 are different, and the status data of the second group of cells collected by the third multiplexer 13 and the fourth multiplexer 14 are the same, the analog-to-digital conversion module 20 sends the first abnormality feedback instruction to the first multiplexer 11 and the second multiplexer 12. The third case is that when the status data of the first group of cells collected by the first multiplexer 11 and the second multiplexer 12 are the same, and the status data of the second group of cells collected by the third multiplexer 13 and the fourth multiplexer 14 are different, the analog-to-digital conversion module 20 sends the second abnormality feedback instruction to the third multiplexer 11 and the fourth multiplexer 12. The fourth case is that when the status data of the first cell respectively collected by the first multiplexer 11, the second multiplexer 12, the third multiplexer 13 and the fourth multiplexer 14 are different, a third abnormality feedback instruction is sent to the first multiplexer 11, the second multiplexer 12, the third multiplexer 13 and the fourth multiplexer 14. It should be noted that in the fourth case, whether the status data of the first cell collected by the first multiplexer 11 and the second multiplexer 12 are the same as the status data of the first cell collected by the third multiplexer 13 and the fourth multiplexer 14 is mainly judged.

It can be seen that since the selector module 10 in the embodiment of the present application further includes the third multiplexer 13 and the fourth multiplexer 14, the third multiplexer 13 and the fourth multiplexer 14 are both used to collect the status data of the second group of cells, and the first group of cells and the second group of cells contain the same first cell. Through the same first cell, cross verification of the status data collected among the first multiplexer 11, the second multiplexer 12, the third multiplexer 13 and the fourth multiplexer 14 can be realized, whether the first multiplexer 11 and the second multiplexer 12 fail at the same time or whether the third multiplexer 13 and the fourth multiplexer 14 fail at the same time can be effectively verified, and thus when a group of multiplexers fail, abnormal sampling data will not be output, thereby further improving the reliability of the battery sampling chip.

It should be noted that more multiplexers may further be integrated in the selector module 10 to adapt to more cells. The number of the cells collected by each multiplexer may also be determined according to the actual situation, which is not limited in the present application.

Figure 3:
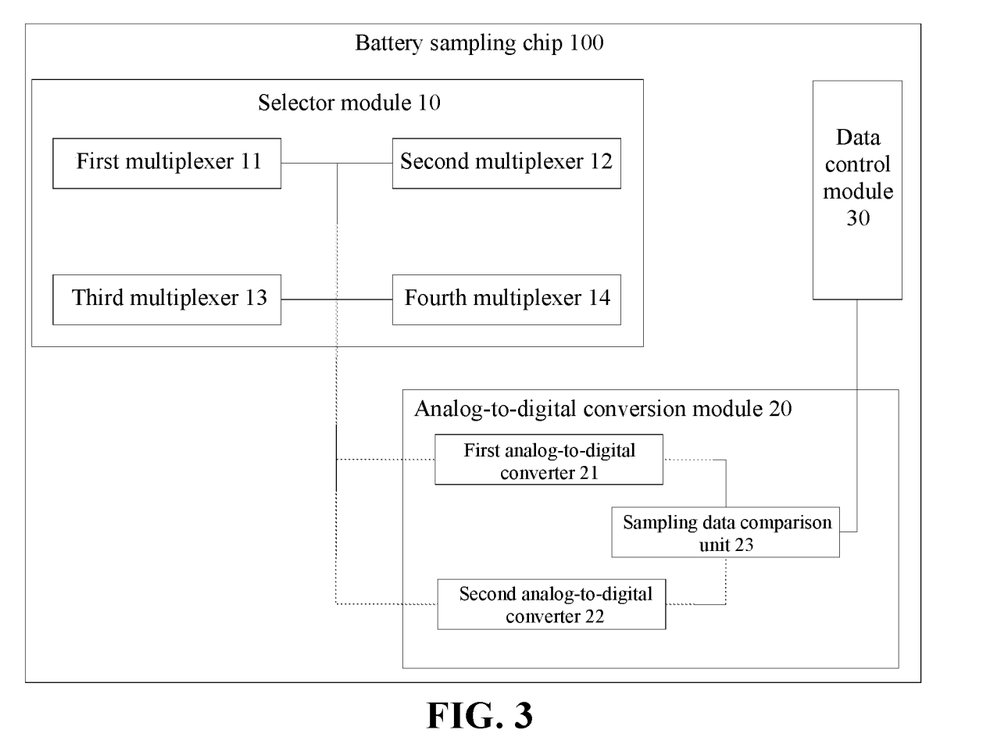
FIG. 3 is a module block diagram of a third battery sampling chip provided by an embodiment of the present application.

Please refer to FIG. 3, optionally, the analog-to-digital conversion module 20 includes a first analog-to-digital converter 21, a second analog-to-digital converter 22 and a sampling data comparison unit 23.

The first analog-to-digital converter 21 and the second analog-to-digital converter 22 are two analog-to-digital converters (ADC) with different precision. The first analog-to-digital converter 21 and the second analog-to-digital converter 22 are both connected with the first multiplexer 11, the second multiplexer 12 and the sampling data comparison unit 23. The sampling data comparison unit 23 is further connected with the data control module 30.

The first analog-to-digital converter 21 and the second analog-to-digital converter 22 are both used to perform analog-to-digital conversion on the status data of the first group of cells. The sampling data comparison unit 23 is used to obtain digital quantities converted by the first analog-to-digital converter 21 and the second analog-to-digital converter 22, and convert the two digital quantities into digital quantities under first precision respectively; send the digital quantities under the first precision to the data control module 30 when the two digital quantities under the first precision are the same, at this time, the digital quantities under the first precision being the converted status data received by the data control module 30; and trigger the data control module to alarm when the two digital quantities under the first precision are different.

Exemplarily, the first analog-to-digital converter 21 performs analog-to-digital conversion on the status data of the first group of cells to obtain a digital quantity A, and the second analog-to-digital converter 22 performs analog-to-digital conversion on the status data of the first group of cells to obtain a digital quantity B. After receiving the digital quantity A and the digital quantity B, the sampling data comparison unit 23 converts them into the digital quantities under the same precision (first precision). For example, the sampling data comparison unit 23 converts the digital quantity A to into a digital quantity C1 under the first precision, and the sampling data comparison unit 23 converts the digital quantity B into a digital quantity C2 under the first precision. When the two digital quantities C1 and C2 under the first precision are the same, it represents that the conversion data of the two analog-to-digital converters are not wrong or abnormal, and the digital quantities under the same first precision are sent to the data control module 30. When the two digital quantities C1 and C2 under the first precision are different, it represents that the conversion data of the two analog-to-digital converters are abnormal or wrong, and the data control module 30 is directly triggered to alarm.

It should be noted that when the two digital quantities C1 and C2 under the first precision are different, the first analog-to-digital converter 21 may be abnormal, the second analog-to-digital converter 22 may be abnormal, or the first analog-to-digital converter 21 and the second analog-to-digital converter 22 may be abnormal at the same time.

In the embodiment of the present application, the first analog-to-digital converter 21 is an 11-bit analog-to-digital converter, and the second analog-to-digital converter 22 is a 16-bit analog-to-digital converter. The first precision above may refer to 12 bits, 11 bits or 16 bits. In addition, the first analog-to-digital converter 21 or the second analog-to-digital converter 22 may also be a 12-bit analog-to-digital converter, which is not limited in the present application.

It can be seen that in the embodiment of the present application, the analog-to-digital conversion module 20 also adopts the redundancy design, and the first analog-to-digital converter 21 and the second analog-to-digital converter 22 are the two analog-to-digital converters with different precision. In this way, abnormal data output in a conversion process due to common mode failure of the analog-to-digital converters can be effectively avoided.

When the two digital quantities under the first precision are different, in order to facilitate subsequent direct maintenance of maintenance personnel and save fault detection time of the maintenance personnel, the sampling data comparison unit 23 is further used to lock the fault analog-to-digital converter when the two digital quantities under the first precision are different. The faulty analog-to-digital converter is an analog-to-digital converter corresponding to the digital quantity with a large difference value from a preset quantity in the two digital quantities under the first precision.

The preset quantity is a digital quantity under the first precision corresponding to normal status data. For example, when the status data are voltage data, the preset quantity is a digital quantity under the first precision corresponding to normal voltage data. For another example, when the status data are temperature data, the preset quantity is a digital quantity under the first precision corresponding to normal temperature data.

In addition, when the selector module 10 further includes the third multiplexer 13 and the fourth multiplexer 14, the first analog-to-digital converter 21 and the second analog-to-digital converter 22 are both further connected with the third multiplexer 13 and the fourth multiplexer 14. For the specific conversion process and sampling data comparison process, please refer to the aforementioned process of analog-digital conversion and data comparison for the status data of the first group of cells, which is not repeated here.

Figure 4:
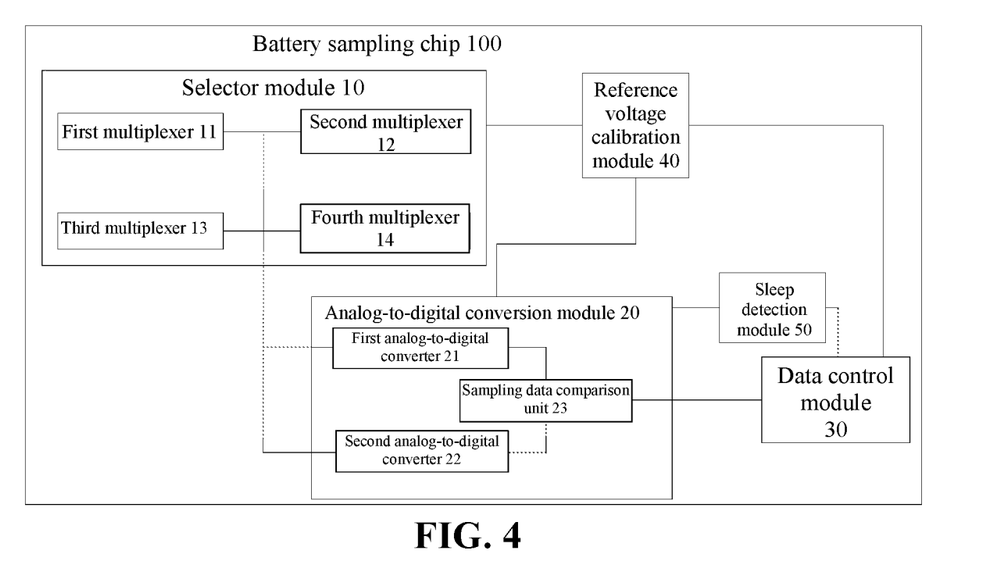
FIG. 4 is a module block diagram of a fourth battery sampling chip provided by an embodiment of the present application.

Please refer to FIG. 4, optionally, the battery sampling chip 100 further includes a reference voltage calibration module 40.

The reference voltage calibration module 40 is connected with the analog-to-digital conversion module 20 and the data control module 30 respectively. The reference voltage calibration module 40 is used to collect a power supply voltage of the battery sampling chip 100 and a power supply voltage of the analog-to-digital conversion module 20; and compare the power supply voltage of the battery sampling chip 100 with the power supply voltage of the analog-to-digital conversion module 20, and trigger the data control module 30 to alarm when the comparison result is inconsistent. Through the reference voltage calibration module 40, whether the power supply voltage of the analog-to-digital conversion module 20 is abnormal can be effectively identified, thus avoiding the case that sampling precision of the battery sampling chip 100 is inaccurate due to interference of environmental factors, and further improving the reliability of the battery sampling chip 100.

In another embodiment, the reference voltage calibration module 40 is further connected with the selector module 10.

The reference voltage calibration module 40 is further used to collect a power supply voltage of the selector module 10, compare the power supply voltage of the battery sampling chip 100 with the power supply voltage of the selector module 10, and trigger the data control module to alarm when the comparison result is inconsistent. Through the reference voltage calibration module 40, whether the power supply voltage of the selector module 10 is abnormal can be effectively identified, thus avoiding the case that sampling precision of the battery sampling chip 100 is inaccurate due to interference of environmental factors, and further improving the reliability of the battery sampling chip 100.

Optionally, the battery sampling chip 100 further includes a sleep detection module 50. The sleep detection module 50 is connected with the analog-to-digital conversion module 20 and the data control module 30 respectively.

The sleep detection module 50 is used to compare the converted status data transmitted by the analog-to-digital conversion module 20 with a preset value when a device connected with the battery sampling chip is in a sleep state, and trigger the data control module 30 to alarm when the comparison result is inconsistent.

It should be noted that the above preset value is a digital quantity corresponding to the status data during normal sleep. For example, when the status data are voltage data, the preset value is a digital quantity corresponding to the voltage data during normal sleep. For another example, when the status data are temperature data, the preset value is a digital quantity corresponding to temperature data during normal sleep.

In the embodiment of the present application, the sleep detection module 50 is also integrated in the battery sampling chip 100, which can save space resources and energy consumption of a controller compared with the prior art that a sleep detection module 50 is arranged in a controller of a battery management system.

Figure 5:
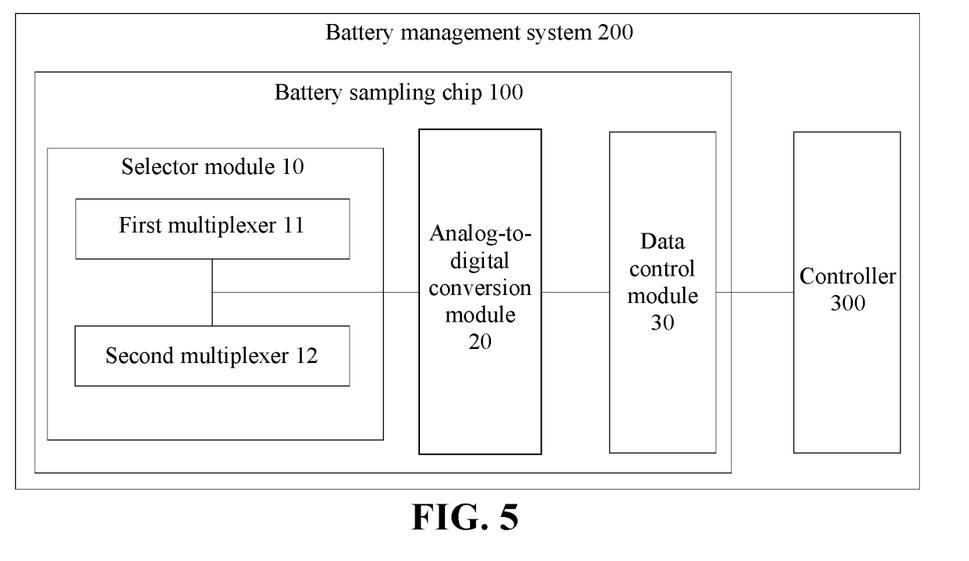
FIG. 5 is a module block diagram of a battery management system provided by an embodiment of the present application.

Please refer to FIG. 5, based on the same inventive concept, an embodiment of the present application further provides a battery management system 200. The battery management system 200 includes a controller 300 and the battery sampling chip 100 provided by the above embodiment.

The controller 300 is connected with a data control module 30 of the battery sampling chip 100, and the controller 300 is used to obtain status data of a battery collected by the battery sampling chip 100.

When the battery includes a first group of cells, the controller 300 is used to obtain status data of the first group of cells collected by the battery sampling chip 100. When the battery includes a first group of cells and a second group of cells, the controller 300 is used to obtain status data of the first group of cells and the second group of cells collected by the battery sampling chip 100.

The controller 300 may be an integrated circuit chip with a signal processing capability. The controller 300 may also be a general-purpose processor, for example, it may be a microcontroller unit (MCU), a central processing unit (CPU), a digital signal processor (DSP), an application specific integrated circuit (ASIC), a discrete gate or transistor logic device, and a discrete hardware component, which may implement or execute all methods, steps and logic block diagrams disclosed in the embodiment of the present application. In addition, the general-purpose processor may be a microprocessor or any conventional processor, etc.

The battery management system 200 may be set on an electrical device containing the battery, such as a new energy vehicle, an unmanned aerial vehicle, and a terminal device, which is not limited in the present application. For example, when the above battery management system 200 is set on the new energy vehicle, the battery management system 200 is a BMS at this time. Through the improved battery sampling chip, the new energy vehicle can reach a performance index automotive safety integration level (ASIL)-D level. It should be said that ASIL is divided into four levels: A, B, C and D. ASIL-D is the highest level and ASIL-A is the lowest level.

Relational terms herein such as "first" and "second" are used only to distinguish one entity or operation from another and do not necessarily require or imply any actual relationship or order between these entities or operations.

The above is only the embodiment of the present application, and is not intended to limit the protection scope of the present application. For those skilled in the art, the present application can have various changes and variations. Any modification, equivalent replacement, improvement and the like made within the spirit and principle of the present application shall all be contained in the protection scope of the present application.

The invention claimed is:

1. A battery sampling chip, comprising:
a selector module, comprising: a first multiplexer and a second multiplexer, the first multiplexer and the second multiplexer being both used to collect status data of a first group of cells, wherein the status data of the first group of cells include status data for a first cell in the first group;
an analog-to-digital conversion module, connected with the first multiplexer and the second multiplexer, the analog-to-digital conversion module being used to send a first abnormality feedback instruction to the first multiplexer and the second multiplexer when the status data of the first group of cells respectively collected by the first multiplexer and the second multiplexer are different, and perform analog-to-digital conversion on the status data of the first group of cells when the status data of the first group of cells respectively collected by the first multiplexer and the second multiplexer are the same, wherein the determination of the status data of the first group of cells respectively collected by the first multiplexer and the second multiplexer are different includes comparing the status data for the first cell in the first group collected by the first and second multiplexers; and
a data control module, connected with the analog-to-digital conversion module, the data control module being used to receive converted status data sent by the analog-to-digital conversion module, and send alarm information when the converted status data sent by the analog-to-digital conversion module are not received within a preset duration; and, wherein the selector module further comprises a third multiplexer and a fourth multiplexer;
the third multiplexer and the fourth multiplexer are both used to collect status data of a second group of cells, the first group of cells and the second group of cells comprise the same first cell, and the first group of cells and the second group of cells belong to the same device; and
the analog-to-digital conversion module is further connected with the third multiplexer and the fourth multiplexer, the analog-to-digital conversion module is further used to send a second abnormality feedback instruction to the third multiplexer and the fourth multiplexer when the status data of the second group of cells respectively collected by the third multiplexer and the fourth multiplexer are different; send a third abnormality feedback instruction to the first multiplexer, the second multiplexer, the third multiplexer and the fourth multiplexer when status data of the first cell respectively collected by the first multiplexer, the second multiplexer, the third multiplexer and the fourth multiplexer are different; and perform analog-to-digital conversion on the status data of the second group of cells when the status data of the second group of cells respectively collected by the third multiplexer and the fourth multiplexer are the same.

2. The battery sampling chip according to claim 1, wherein the analog-to-digital conversion module comprises a first analog-to-digital converter, a second analog-to-digital converter and a sampling data comparison unit;
the first analog-to-digital converter and the second analog-to-digital converter are two analog-to-digital converters with different precision; the first analog-to-digital converter and the second analog-to-digital converter are both connected with the first multiplexer, the second multiplexer and the sampling data comparison unit; and the sampling data comparison unit is further connected with the data control module;
the first analog-to-digital converter and the second analog-to-digital converter are both used to perform analog-to-digital conversion on the status data of the first group of cells; and
the sampling data comparison unit is used to obtain digital quantities converted by the first analog-to-digital converter and the second analog-to-digital converter, and convert the two digital quantities into digital quantities under first precision respectively; send the digital quantities under the first precision to the data control module when the two digital quantities under the first precision are the same, wherein the digital quantities under the first precision are the converted status data; and trigger the data control module to alarm when the two digital quantities under the first precision are different.

3. The battery sampling chip according to claim 2, wherein the first analog-to-digital converter is an 11-bit analog-to-digital converter, and the second analog-to-digital converter is a 16-bit analog-to-digital converter.

4. The battery sampling chip according to claim 2, wherein the sampling data comparison unit is further used to lock a faulty analog-to-digital converter when the two digital quantities under the first precision are different, and the faulty analog-to-digital converter is an analog-to-digital converter corresponding to the digital quantity with a large difference value from a preset quantity in the two digital quantities under the first precision.

5. The battery sampling chip according to claim 1, wherein the battery sampling chip further comprises a reference voltage calibration module, the reference voltage calibration module being respectively connected with the analog-to-digital conversion module and the data control module, wherein
the reference voltage calibration module is used to collect a power supply voltage of the battery sampling chip and a power supply voltage of the analog-to-digital conversion module; and compare the power supply voltage of the battery sampling chip with the power supply voltage of the analog-to-digital conversion module, and trigger the data control module to alarm when the comparison result is inconsistent.

6. The battery sampling chip according to claim 5, wherein the reference voltage calibration module is further connected with the selector module, and the reference voltage calibration module is further used to collect a power supply voltage of the selector module, compare the power supply voltage of the battery sampling chip with the power supply voltage of the selector module, and trigger the data control module to alarm when the comparison result is inconsistent.

7. The battery sampling chip according to claim 1, wherein the battery sampling chip comprises a sleep detection module, wherein
the sleep detection module is respectively connected with the analog-to-digital conversion module and the data control module, and the sleep detection module is used to compare the converted status data transmitted by the analog-to-digital conversion module with a preset value when a device connected with the battery sampling chip is in a sleep state, and trigger the data control module to alarm when the comparison result is inconsistent.

8. The battery sampling chip according to claim 1, wherein the status data comprise voltage data and/or temperature data.

9. A battery management system, comprising a controller and the battery sampling chip according to claim 1, wherein the controller is connected with the data control module of the battery sampling chip, and the controller is used to obtain status data of a battery collected by the battery sampling chip.

* * * * *